United States Patent
Tanaka

[11] Patent Number: 5,174,855
[45] Date of Patent: Dec. 29, 1992

[54] SURFACE TREATING APPARATUS AND METHOD USING VAPOR

[75] Inventor: Masato Tanaka, Shiga, Japan

[73] Assignee: Dainippon Screen Mfg. Co. Ltd., Japan

[21] Appl. No.: 511,194

[22] Filed: Apr. 20, 1990

[30] Foreign Application Priority Data

Apr. 28, 1989 [JP] Japan .................. 1-109292

[51] Int. Cl.⁵ .............................................. B05D 1/00
[52] U.S. Cl. ..................... 156/626; 156/646; 156/345; 134/31; 134/102.1
[58] Field of Search ............ 156/646, 345, 626; 134/3, 31, 41, 102

[56] References Cited

U.S. PATENT DOCUMENTS

| | | | |
|---|---|---|---|
| 4,092,257 | 5/1978 | Fozzard | 134/40 X |
| 4,169,807 | 10/1979 | Zuber | 134/30 X |
| 4,605,479 | 8/1986 | Faith, Jr. | 156/646 X |
| 4,655,956 | 4/1987 | Basu et al. | 134/12 X |
| 4,715,900 | 12/1987 | Connon et al. | 134/31 |
| 4,749,440 | 6/1988 | Blackwood et al. | 156/646 |
| 4,788,043 | 11/1988 | Kagiyama et al. | 134/12 X |
| 4,790,955 | 12/1988 | Lund et al. | 134/2 X |
| 4,795,497 | 1/1989 | McConnell et al. | 134/18 |
| 4,902,351 | 2/1990 | Kunze et al. | 134/3 |

FOREIGN PATENT DOCUMENTS

| | | |
|---|---|---|
| 1673058 | 1/1968 | Fed. Rep. of Germany . |
| 1564240 | 4/1968 | France . |
| 2085603 | 3/1971 | France . |
| 61-148820 | 7/1986 | Japan . |
| WO88/07263 | 9/1988 | PCT Int'l Appl. . |

*Primary Examiner*—Thi Dang
*Attorney, Agent, or Firm*—Ostrolenk, Faber, Gerb & Soffen

[57] ABSTRACT

A surface treating apparatus using vapor includes a container for holding two liquids, e.g., hydrogen fluoride and water, which exhibits an azeotropic phenomenon under predetermined conditions, and an azeotropic condition establishing device for conditioning the container to satisfy the predetermined azeotropic conditions. Under the azeotropic conditions, a vapor mixture having the composition of the liquid mixture is produced, and surface treatment of substrates or the like is performed using the vapor mixture. Since the vapor of the liquid mixture in the azeotropic state is used for surface treatment of substrate, surface treatment is effected under fixed conditions all the time.

27 Claims, 7 Drawing Sheets

FIG.3

| TOTAL PRESSURE P (mm Hg) | H F COMPOSITION X (%) | AZEOTROPY TEMPERATURE T (°C) |
|---|---|---|
| 760 | 37.73 | 111.4 |
| 600 | 37.83 | 104.7 |
| 400 | 38.01 | 93.9 |
| 200 | 38.29 | 77.0 |
| 100 | 38.58 | 61.7 |
| 50 | 38.83 | 47.9 |
| 10 | 39.46 | 20.3 |
| 5 | 39.75 | 10.0 |

| | AZEOTROPY | QUASI - AZEOTROPY |
|---|---|---|
| |  |  |
| | ○ : HF<br>● : H2O | □ : N2 |
| COMPO.<br>X | Xq = XHF + XH2O | Xq' = XHF + XH2O + Xd(XN2) |
| TEMP.<br>T | Tq | Tq' |
| PRESS.<br>P | Pq = PHF + PH2O | Pq' = Pq(PHF + PH2O) + Pd |

SURFACE TREATING APPARATUS AND METHOD USING VAPOR

BACKGROUND OF THE INVENTION

1. Field of the Invention

This invention relates to an apparatus and a method for treating (etching, cleaning, etc.) the surfaces of substrates by using vapor of a surface treating liquid mixture having two or more components, and particularly it relates to a surface treating apparatus and a method using vapor wherein the composition of vapor to be used can be easily controlled.

2. Description of the Related Arts

A surface treating apparatus using vapor which is of interest to the present invention is disclosed in Japanese Patent Laying-Open No. 61-148820.

According to this bulletin, a surface treating liquid mixture of composed of hydrogen fluoride, water and alcohol is stored in a storage tank installed under a treating chamber, and in use, the liquid mixture is heated for evaporation. The vapor mixture is fed to substrates to treat their surfaces.

What is most important in surface treatment of substrates is to maintain the composition of the vapor mixture throughout one batch cycle. One reason is that a variation in the composition will cause a variation in the etching rate. As a result, uniform surface treatment of substrates becomes impossible. Another reason is that when a number of substrates are treated, yield varies.

However, the aforesaid bulletin discloses nothing about a method for controlling the composition of vapor mixture to maintain it at a fixed value.

A method for controlling the composition of vapor mixture is disclosed in U.S. Pat. No. 4,749,440.

According to this bulletin, an anhydrous hydrogen fluoride source, a water source and a dry nitrogen gas source are separately prepared. Water from the water source is metered by a metering diaphragm pump and fed to a water vapor chamber. The dry nitrogen gas from the dry nitrogen gas source has its flow rated controlled by a first flow controller and fed to the water vapor chamber. The water vapor resulting from the water being heated to a predetermined temperature for evaporation in the water vapor chamber is mixed with the dry nitrogen gas to provide a water vapor-containing nitrogen gas. This water vapor-containing nitrogen gas is mixed with dry nitrogen gas from the dry nitrogen gas source having its flow rate controlled by a second flow controller and the mixture is fed to an aspirator.

On the other hand, anhydrous hydrogen fluoride gas (a reactive gas for surface treatment) resulting from anhydrous hydrogen fluoride being heated at a predetermined temperature in the anhydrous hydrogen fluoride source is fed to the aspirator through a third flow controller. In the third flow controller, controlled heating is effected for preventing liquefaction or condensation of anhydrous hydrogen fluoride gas and maintained the anhydrous state.

After the water vapor-containing nitrogen gas, dry nitrogen gas and anhydrous hydrogen fluoride gas which have been fed to the aspirator have been mixed together, they are fed to substrates in a reaction chamber (or treating chamber).

In the system described above, in order to control the composition of the vapor mixture, various control are performed: water flow control by the metering diaphragm pump, temperature control in the water vapor chamber, flow control of dry nitrogen gas by the first and second flow controllers, temperature control in the anhydrous hydrogen fluoride source, and flow control and temperature control by the third flow controller.

However, since the composition is controlled by separate control of the amount of each component, the arrangement of the entire control system is very complicated. As a result, it is not easy to provide a vapor mixture of required composition, and to maintain the composition of the vapor mixture at a required value.

Since the composition of the vapor mixture is controlled by feeding hydrogen fluoride gas from the hydrogen fluoride gas source and water vapor from the water source, the concentration of hydrogen fluoride gas in the hydrogen fluoride gas source is very high.

In fact, according to said U.S. Patent, industrial hydrogen fluoride having a concentration of 99,99% is used. If it is desired to use a commercially available solution composed of 49% hydrogen fluoride and 51% water instead of said industrial hydrogen fluoride, it is necessary to heat it to provide dry hydrogen fluoride before it can be used.

However, the use of anhydrous hydrogen fluoride of such high concentration would entail serious danger affecting people's lives if it should leak.

SUMMARY OF THE INVENTION

Accordingly, an object of the invention is to easily obtain a vapor mixture having a required composition for use in a surface treating apparatus using vapor.

Another object of the invention is to easily maintain the composition of vapor mixture at a required value or ratio in a surface treating apparatus using vapor.

Another object of the invention is to increase safety in a surface treating apparatus using vapor.

Another object of the invention is to prevent dewing in a surface treating apparatus.

Another object of the invention is to easily obtain a vapor mixture of required composition for use in a surface treating method using vapor.

Another object of the invention is to increase safety in a surface treating method using vapor.

These objects are achieved by a surface treating apparatus according to the present invention comprising a liquid container for holding a mixture of at least two liquids which exhibits azeotropy under predetermined conditions, the container having space to generate vapor mixture of azeotropy in the upper portions thereof, an azeotropic condition establishing device for conditioning said container to establish azeotropic conditions, a vapor mixture of the liquid mixture of at least two liquids being produced under the azeotropic conditions, and a surface treating unit for treating the surfaces of objects to be treated by using the azeotropic vapor mixture.

According to the invention, surface treatment is carried out under azeotropic conditions. Under azeotropic conditions, since a vapor mixture having the same composition as that of the liquid mixture is produced, there is no possibility that the composition of the vapor mixture will vary. As a result, in the surface treating apparatus a vapor having a given composition is easily obtained.

Preferably, the azeotropic condition establishing device is adapted to adjust pressure and temperature to provide predetermined azeotropic conditions. The liquid container is controlled to provide predetermined pressure and temperature so that the liquid mixture therein exhibits azeotropy.

More preferably, the vapor mixture is produced in the liquid container and the surface treating apparatus includes a diluting gas feeder for feeding a diluting gas to the liquid container thereby to generate a quasi-azeotropic vapor mixture.

The surface treating apparatus using vapor comprises the aforesaid elements. Surface treatment is performed in the presence of the diluting gas. Generally, at atmospheric pressure, azeotropy takes place at higher temperature. On the other hand, the use of a diluting gas lowers the partial pressures of the components of the mixture vapor resulting from the liquids which leads to azeotropy by the corresponding amount, a fact which means that a quasi-azeotropic atmosphere similar to one in which an azeotropic phenomenon takes place is established at a lower temperature in the liquid container. Therefore, even at atmospheric pressure, surface treatment is performed at lower temperature. As a result, safety can be increased in the surface treating apparatus using vapor.

According to another aspect of the invention, a surface treating method using vapor comprises the steps of preparing a mixture of at least two liquids which exhibits an azeotropic phenomenon under predetermined conditions, controlling the mixture of at least two liquids to satisfy azeotropic conditions, an azeotropic vapor mixture of the liquid mixture of at least two liquids being produced under azeotropic conditions, and treating the surfaces of objects to be treated by using the azeotropic vapor mixture.

Surface treatment is effected by using an azeotropic phenomenon. As a result, in a surface treating method using vapor, surface treatment is effected using vapor having a given composition.

Preferably, the step of preparing a mixture of two liquids includes the steps of preparing a container and feeding two liquids to said container, whereby a space is defined in a region where the liquids in the container are not held, so that the azeotropic vapor mixture is produced in said space. The surface treating method further includes the step of setting the container at a predetermined temperature, and generating a quasi-azeotropic vapor mixture by feeding a diluting gas to the space so that the pressure in the container is higher than at least atmospheric pressure.

Since the surface treating method preferably includes the aforesaid steps, a quasi-azeotropic atmosphere similar to one in which azeotropy takes place is produced in the container at atmospheric pressure. As a result, high safety is obtained for the surface treating method.

"Azeotropy" means, as is known in the art, a phenomenon such that when a liquid mixture evaporates (boils), the composition of the vapor mixture coincides with the composition of the liquid mixture if the composition, temperature and pressure of said liquid mixture satisfies a given relation.

Herein, the "conditions under which the relation between the composition, temperature and pressure ensures azeotropy" include the following three types.

(1) Supposing that the composition X is set at an arbitrary value X1 within a predetermined range, the values of the temperature T and pressure P at which azeotropy takes place with said set composition X1 are uniquely determined. Let them be indicated by T1 and P1, respectively, then the combination (X1, T1, P1) is the azeotropic conditions.

(2) Supposing that the pressure P is set at an arbitrary value P2, the values of the composition X and temperature T at which azeotropy takes place at said set pressure P2 are uniquely determined. Let them be indicated by X2 and T2, respectively, then the combination (X2, T2, P2) is the azeotropic conditions.

(3) Supposing that the temperature T is set at an arbitrary value T3, the values of the composition X and pressure P at which azeotropy takes place at said temperature T3 are uniquely determined. Let them be indicated by X3 and P3, respectively, then the combination (X3, T3, P3) is the azeotropic conditions.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a table showing the relation between the total pressure and the composition of hydrogen fluoride in each azeotropic point;

DESCRIPTION OF THE PREFERRED EMBODIMENTS (1) First Embodiment (i) Principle

The principle of a first embodiment of the invention will now be described.

When a surface treating liquid mixture is evaporated under azeotropic conditions, the composition of the vapor mixture coincides with that of the liquid mixture. Therefore, evaporation of the liquid mixture under azeotropic conditions results in the composition of the vapor mixture being maintained at a fixed value (the same as the composition of the liquid mixture).

For this purpose, the composition of the liquid mixture must be maintained at the same value as that of the liquid mixture. In the azeotropic state, since the liquid mixture is evaporated to provide a vapor mixture having the same composition as that of the liquid mixture, there is no possibility that the composition of the liquid mixture will vary with the evaporation of the liquid mixture. Therefore, as the amount of the liquid mixture decreases with the evaporation of the liquid mixture, it is only necessary to feed a fresh supply of liquid mixture of the same composition as that of one being used. Controlling the composition of the liquid mixture in such a manner as to satisfy the azeotropic conditions means that it is only necessary to control only one object, the liquid mixture. Therefore, as compared with the prior art in which the respective amounts of the components to be fed are separately controlled to control the composition of the liquid mixture, the control according to the invention is easy and accurate.

That is, the principle of the invention lies in converting the phenomenon called azeotropy, which has been a disadvantageous factor in the field of fractional distillation in that it makes it impossible to separate the components, into an advantageous factor and utilize it in controlling the composition of a liquid mixture for treating the surfaces of substrates.

Thus, the surface treating liquid mixture is controlled to satisfy the azeotropic conditions, thereby making it easier to provide a vapor mixture of required composition and to maintain the composition of the vapor mixture at the required composition.

Since the production of a gas having a composition of two or more components necessary for treating the surfaces of substrates is effected by evaporation of a surface treating liquid mixture having said composition, there is no need to handle the individual gas components; thus, handling is facilitated. In the case where care must be taken when one component or another is a gas of high density, the invention makes it no longer necessary to handle such gas of high density and hence danger is avoided.

(ii) Examples of Arrangement of the Apparatus

Figure 1:
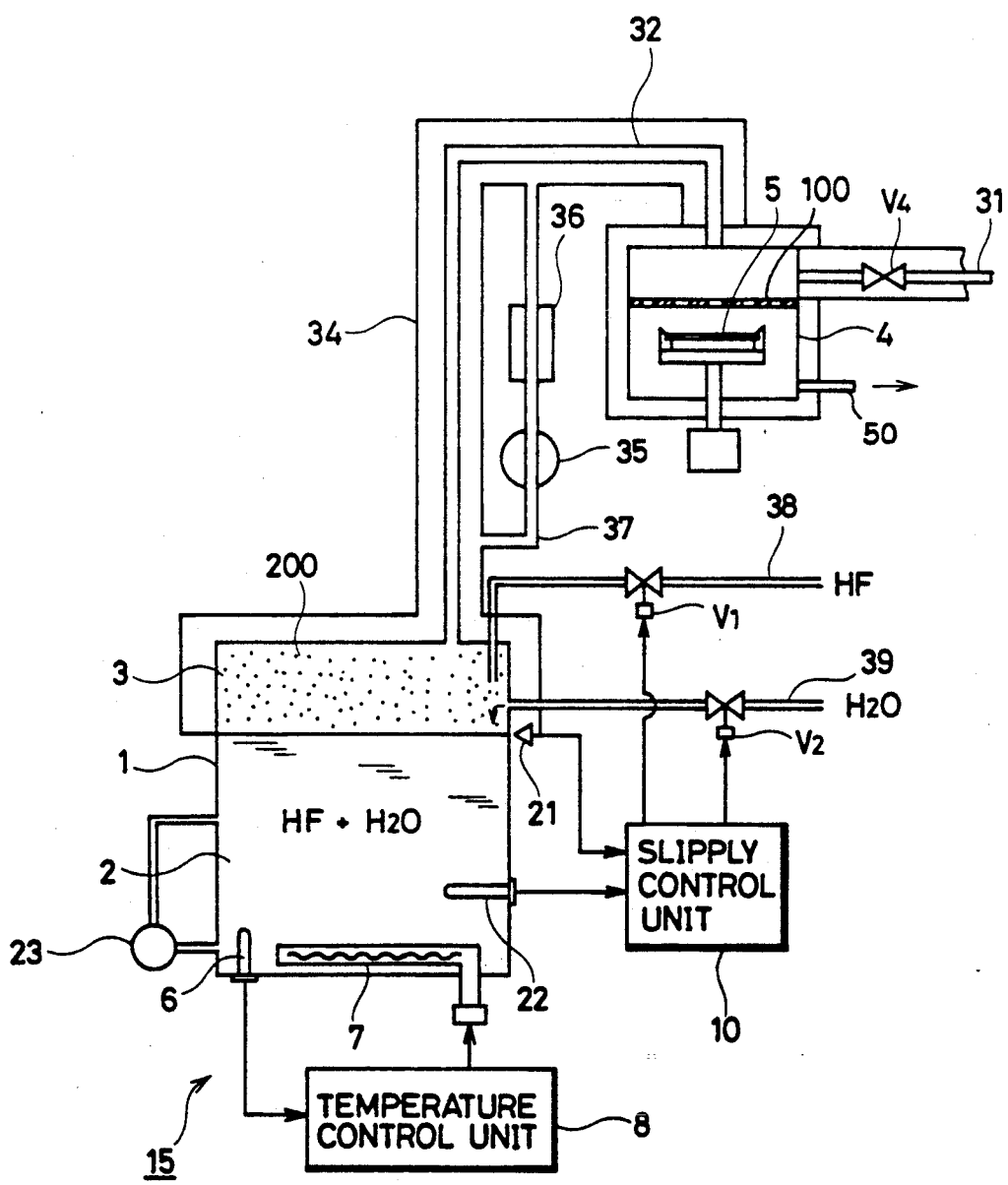
FIG. 1 is a schematic diagram showing a surface treating apparatus according to a first embodiment of the present invention.

The arrangement of a surface treating apparatus according to a first embodiment of the invention will now be described. Referring to FIG. 1, the surface treating apparatus according to the first embodiment comprises a liquid mixture storage tank 1 for storing a surface treating liquid mixture 2, a heating device 15 for conditioning the liquid mixture storage tank 1 for azeotropic conditions, a treating chamber 4 for treating the surface of a substrate 5 by using a vapor mixture 3 produced in the space 200 of the liquid mixture storage tank 1, and pipes 32 for conveying the vapor mixture 3 produced in the liquid mixture storage tank 1 to the treating chamber 4. The heating device 15 comprises a temperature sensor 6 for detecting the temperature of the liquid mixture 2, a temperature control unit 8 for detecting the temperature from the temperature sensor 6 and controlling the liquid mixture 2 so that it is at the predetermined azeotropic temperature, and a heater 7. The vapor mixture 3 may be diluted by $N_2$ gas in the upper portion of the treating chamber 4 before it is fed to the substrate 5 through a punch plate 100 mounted above the substrate 5. The diluting amount by the $N_2$ gas is changed by adjusting the opening of the valve V4 mounted on the pipe 31 according to the treating conditions for the substrate 5 in the treating chamber 4.

The treating chamber 4, the vapor mixture pipe 32 for conveying the vapor mixture 3, and the $N_2$ gas pipe 31 for dilution are covered with a heat insulating material 34 constituting a temperature control member. A heater 36 is attached to the heat insulating material 34 to provide hot water as a heat medium which is circulated through the heat insulating material 34 by a pump 35. In this manner, the vapor mixture produced by the azeotropic phenomenon is prevented from dewing in the pipe and in the treating chamber by keeping the temperature of those portions above the dew point.

As for the surface treating liquid mixture 2, use is made of a liquid mixture of hydrofluoric acid HF and water $H_2O$. If a surface treating liquid mixture is available as such, it may be used as said liquid mixture 2 and fed directly to the liquid mixture storage tank 1. If such liquid mixture 2 is not available, pipes 38 and 39 are provided for conveying individual liquids to the liquid mixture storage tank 1. The liquid mixture storage tank 1 is provided with a circulation pump 23 for stirring the liquid mixture. In this connection, preferably, the level of the liquid mixture 2 in the liquid mixture storage tank 1 is detected by a level sensor 21 while the composition of the liquid mixture 2 is detected by a composition sensor 22, ensuring that the liquid mixture 2 has the composition which causes the predetermined azeotropic phenomenon. In this case, a supply control unit 10 controls an HF feed valve V1 and and $H_2O$ feed valve V2 to ensure that the liquid mixture 2 has the predetermined composition.

In operation, the surface treating liquid mixture 2 composed of two or more components stored in the liquid mixture storage tank 1 is evaporated to provide a vapor mixture 3, which is then fed to the treating chamber 4. In etching or cleaning the surface of the substrate 5, such as a semiconductor wafer, which is put in the treating chamber 4, the liquid mixture 2 is evaporated under the conditions which ensure azeotropy in relation to its composition X, temperature T and pressure P.

Figure 2:
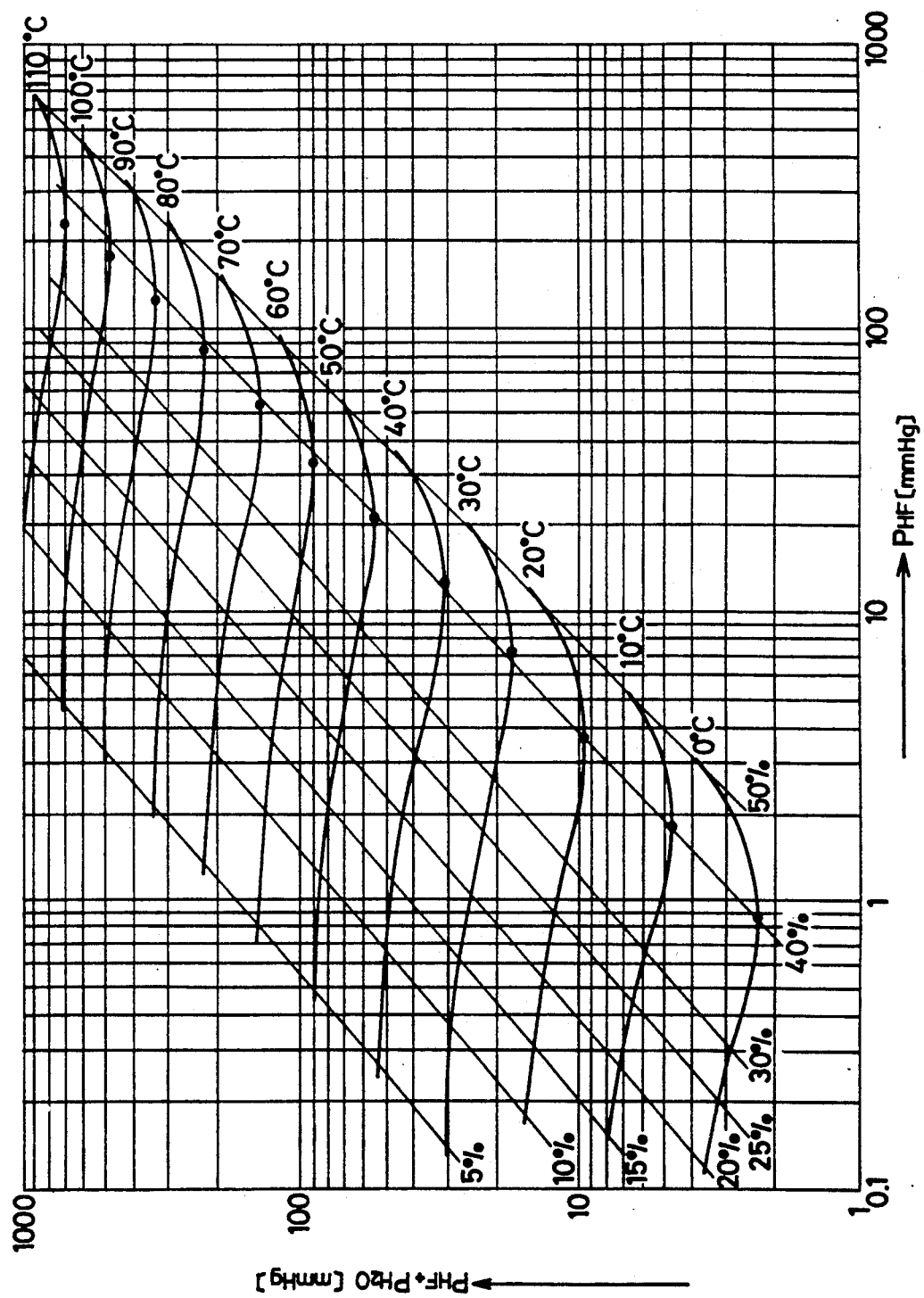
FIG. 2 is a vapor pressure diagram of a liquid mixture of hydrogen fluoride HF and water $H_2O$.

The azeotropic phenomenon of hydrogen fluoride HF and water $H_2O$ will now be described with reference to FIG. 2. FIG. 2 is a vapor pressure diagram of hydrogen fluoride HF and water $H_2O$. The partial pressure $P_{HF}$ of hydrogen fluoride HF is plotted on the horizontal axis and the total pressure ($P_{HF} + P_{H2O}$) which is the sum of the partial pressure $P_{HF}$ of hydrogen fluoride and the partial pressure $P_{H2O}$ of water vapor is plotted on the vertical axis. The relation between the partial pressure $P_{HF}$ and the total pressure ($P_{HF} + P_{H2O}$) is shown with temperature T used as a parameter.

A plurality of diagonal lines are those indicating the compositions (mole fractions) of hydrogen fluoride contained in the liquid mixture. As is known, in the characteristic curve for each temperature, the point where the total pressure ($P_{HF} + P_{H2O}$) is at a minimum is the azeotropic point, which is shown by a black dot.

Figure 4:
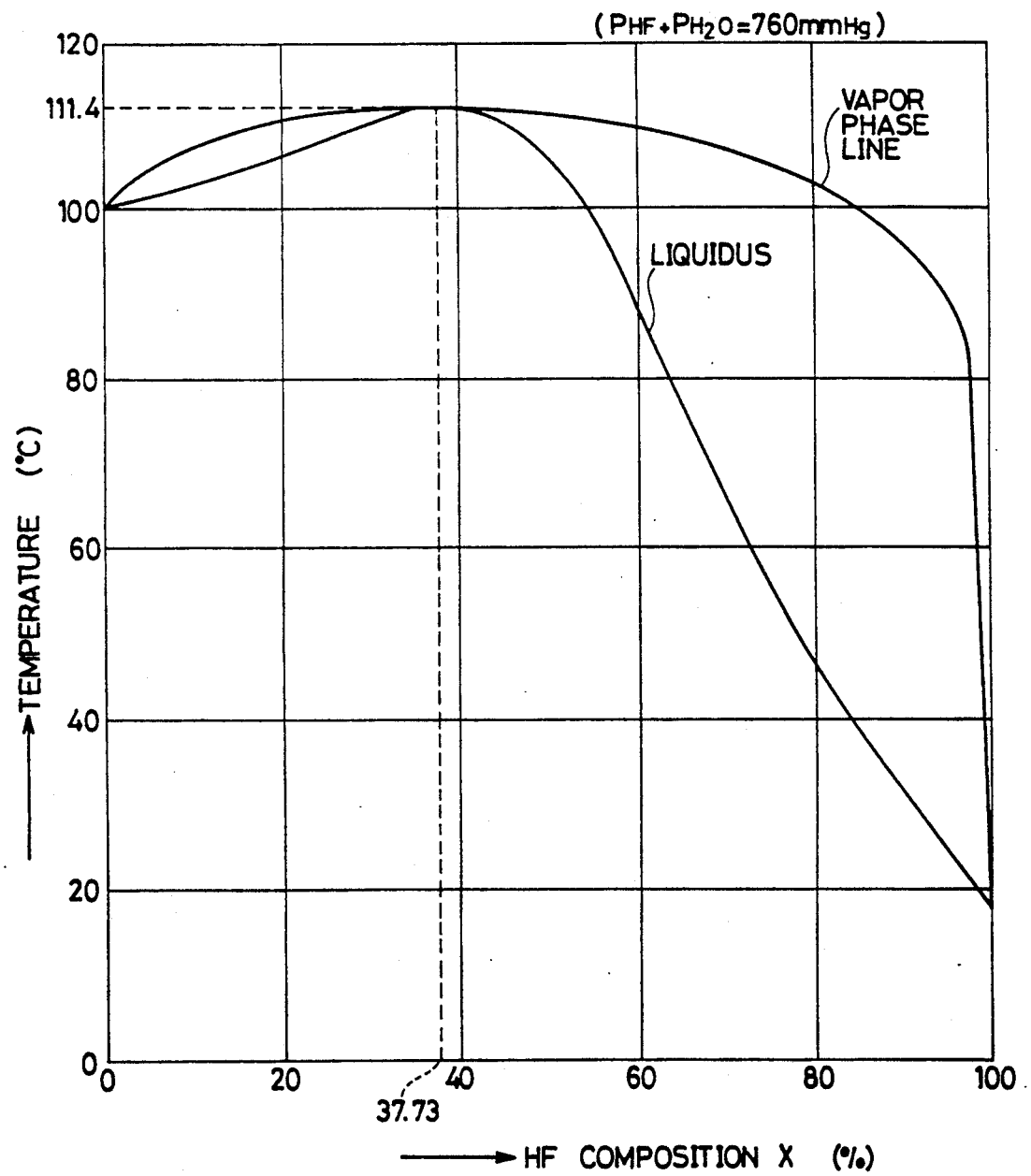
FIG. 4 is a diagram showing the relation between the composition of hydrogen fluoride and temperature when the total pressure is 760 mmHg.

The relation between the total pressure P (mmHg), the composition X (%) of hydrogen fluoride HF and the azeotropic temperature T (°C.) at each azeotropic point is shown in FIG. 3. FIG. 4 shows composition versus temperature characteristics when the total pressure P ($=P_{HF} + P_{H2O}$) is 760 mmHg, the horizontal axis indicating the composition X (%) of hydrogen fluoride HF, the vertical axis indicating the temperature T (°C.).

In FIG. 4, the liquidus and vapor phase line of the liquid mixture of hydrogen fluoride HF and water $H_2O$ at 760 mmHg contact each other at a temperature T of 111.4° C. At this point of contact, which is the azeotropic point, the composition X of hydrogen fluoride HF is X=37.73% (see the first row in FIG. 3.)

A surface treating liquid mixture 2 composed of 37.73% hydrofluoric acid and 100−37.73=62.26% water $H_2O$ is stored in the liquid mixture storage tank 1. Temperature control is effected by a heating device 15 comprising a temperature sensor 6, a heater 7 and a temperature control unit 8 so that the temperature T of the liquid mixture 2 is maintained at 111.4° C.

Further, since the liquid mixture storage tank 1 communicates with the treating chamber 4 (at atmospheric pressure), there is no possibility that the pressure P of the vapor mixture 3 will exceed 760 mmHg, nor is a possibility that it will fall below 760 mmHg since the temperature is controlled so that the azeotropic temperature T is 111.4° C. and the liquid mixture is in the boiling state. This is because an exhaustion pipe 50 of the chamber 4 is maintained at atmospheric pressure.

In this manner, the evaporation, or azeotropy, of the surface treating liquid mixture 2 takes place when the total pressure P of the atmosphere gas, or the vapor mixture, in the liquid mixture storage tank 1 is 760 mmHg (atmospheric pressure).

The composition X of the liquid mixture 2 is $HF:H_2O = 37.73:62.26$, and the composition X of the vapor mixture 3 is also $HF:H_2O = 37.73:62.27$; thus, the two compositions coincide with each other. Although the amount of the liquid mixture 2 decreases as the evaporation proceeds, the compositions of the liquid 2 and vapor mixtures 3 are maintained constant.

The vapor mixture 3 having its composition X maintained constant flows into the treating chamber 4 communicating with the liquid mixture storage tank 1. If the required liquid mixture 2 is not available, hydrofluoric acid HF and water $H_2O$ are fed by a feed control unit 10 in such a manner that the amount of the liquid mixture is within a given range.

In addition, it is not always necessary that the composition X of the liquid mixture 2 to be fed to the liquid mixture storage tank 1 be in absolute coincidence with said $HF:H_2O = 37.73:62.27$ which is the azeotropic composition at atmospheric pressure. For example, $HF:H_2O$ may be $37.73 \pm 5:62.27 \pm 5$. As a little time passes from the time the liquid mixture 2 of such composition is fed, the excess component evaporates first. As a result, the composition of the liquid mixture 2 in the liquid mixture storage tank 1 becomes almost equal to $HF:H_2O = 37.73:62.27$. In the case where a little variation in the composition of the vapor mixture is allowable, the composition may be further deviated beyond $HF:H_2O = 37.73 \pm 5:62.27 \pm 5$, though this depends on the extent of the variation allowance.

As to the surface treating liquid mixture 2, besides a liquid mixture of hydrofluoric acid HF and water $H_2O$ use may be made of a liquid mixture of hydrochloric acid HCl and Water $H_2O$, and a liquid mixture of hydrofluoric acid HF, water $H_2O$ and ethanol $C_2H_5OH$. In the case of the former, azeotropy takes place when the composition of hydrochloric acid HCl at 760 mmHg is 20.22% and temperature is 108.58° C., and in the case of the latter it takes place when the composition of the hydrofluoric acid at 760 mmHg is 30% and temperature is 103° C. An azeotropic vapor mixture of $HCl + H_2O$ is used to promptly etch a film of indium tin oxide (ITO) formed on a surface of a glass substrate for use in a liquid crystal display.

In addition, it is also possible to use a liquid mixture of $HF + HNO_3 + H_2O$, a liquid mixture of $HCl + HNO_3 + H_2O$, a liquid mixture of $NH_4OH + H_2O$, and a liquid mixture of $HNO_3 + H_2O$.

Especially, an azeotropic vapor mixture of $HNO_3 + H_2O$ is used to remove unnecessary attachments made of alumina $Al_2O_3$, an organic matter and chlorine called a sidewall polymer generated after dry-etching of Al wiring.

(2) Second Embodiment (i) Principle

The principle of a vapor surface treating apparatus according to a second embodiment of the invention is as follows.

In the first vapor surface treating method, evaporation of a liquid mixture has been effected in an atmosphere constituted solely of the respective vapors of the components of the liquid mixture. In the second embodiment, evaporation of a liquid mixture is effected in an atmosphere which contains a diluting gas besides the respective vapors of the components of a liquid mixture.

That is, if the vapor surface treating conditions in the first embodiment are expressed by (Xq, Tq, Pq), in which the relation between the composition X, temperature T and pressure P is azeotropic, then it follows that the vapor surface treating conditions in the second embodiment, with the temperature T held at Tq, the pressure P is increased by the diluting gas having a partial pressure Pi, so that P (total pressure) = Pq + Pi. This state will hereinafter be referred to as "quasi-azeotropy."

Figure 5:
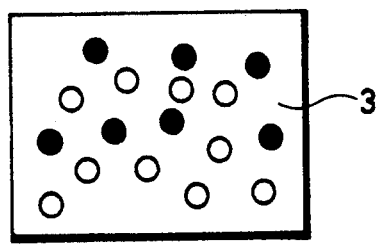
FIG. 5 is a schematic view showing the azeotropic and quasi-azeotropic states.
Figure 5:
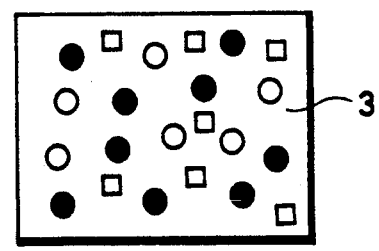

Referring to FIG. 5, the quasi-azeotropic state according to the invention will now be described with reference to FIG. 5. The right-hand side of the figure shows the azeotropic state, and the left-hand side shows the quasi-azeotropic state. Each shows the composition X, temperature T and pressure P of a vapor mixture.

Referring to FIG. 5, under azeotropic conditions a vapor mixture 3 contains only HF and $H_2O$. In contrast, in the quasi-azeotropic state, HF, $H_2O$ and $N_2$ are contained. These states are expressed by formulas shown in a table in FIG. 5. In the azeotropic state, the composition Xq contains only hydrogen fluoride $X_{HF}$ and $X_{H2O}$, while in the quasi-azeotropic state, Xq, additionally contains nitrogen gas $X_{N2}$ (Xd).

As for the temperature, it is the azeotropic temperature Tq in the azeotropic state. The temperature in the quasi-azeotropic state is Tq'. The reason is described in the following. In this case since $N_2$ gas is contained in the vapor mixture 3 in the quasi-azeotropic state, the respective partial pressures of HF and $H_2O$ are considerably low. As a result, as shown in FIG. 2, the temperature Tq' in the quasi-azeotropic state is much lower than the temperature Tq in the azeotropic state.

The pressure will now be described. In the azeotropic state on the left-hand side, the pressure is $P_q$ because of the azeotropic state. In contrast, in the quasi-azeotropic state, the sum of the partial pressure Pq, which HF and $H_2O$ have, and the partial pressure Pd, which $N_2$ gas has, is set at the predetermined pressure (which is atmospheric pressure in this embodiment).

The azeotropic state (Xq, Tq, Pq) is a boiling state, but the state [Xq', Tq', Pq' (Pq+Pd)] is not a boiling state.

Further, in the quasi-azeotropic state, the compositions of the component vapors which constitute the liquid mixture are lower than the composition of the liquid mixture by an amount corresponding to the amount diluted by the diluting gas.

However, even if the case of evaporation under the conditions [Xq', Tq', Pq' (Pq+Pd)], I have conceived and found that the composition of the vapor mixture excluding the diluting gas coincides with the composition of the liquid mixture. The surface treating conditions according to the second embodiment of the invention are based on this concept.

In other words, the surface treating conditions according to the second embodiment of the invention are as follows.

The relation between the composition X, temperature T, and pressure P of the atmosphere for evaporation of the liquid mixture, from which the composition Xd and partial pressure Pd of the diluting gas are subtracted, corresponds to the azeotropic state (Xq, Tq, Pq). That is, if control is effected in such a manner as to satisfy the conditions $X=Xq'-Xd=Xq$, $T=Tq'$, $Pq'-Pd=Pq$, then the composition of the liquid mixture coincides with the composition of the vapor mixture excluding the diluting gas notwithstanding of the presence of the diluting gas.

In the case where no diluting gas is used as in the first gas surface treating conditions, when the pressure P of the atmosphere in which liquid mixture is evaporated is set at a required pressure (e.g., atmospheric pressure or a pressure approximately equal thereto), then the composition and temperature which lead to the azeotropic state at the pressure Pn are Xn and Tn, respectively. However, there is a case where either such composition Xn or such temperature Tn is not preferable (e.g., Tn may be so high as to cause troubles).

Thus, the temperature Tn' such that Tn>Tn' is set. It is the composition Xn, and pressure Pn', that is, (Xn', Tn', Pn'), that lead to the azeotropic state at the temperature Tn'. Then, Pn'<Pn, and it becomes necessary to decrease the pressure.

However, there is a strong possibility that a vacuum pump and piping for pressure reduction are corroded by the reactive gas; thus, such atmosphere can hardly be utilized.

In contrast, if the concept of quasi-azeotropy is utilized, the composition of the vapor mixture can be made constant at a required pressure Pn. More particularly, the pressure of an atmosphere of azeotropy (Xn', Tn', Pn') is increased by the diluting gas to provide an atmosphere of quasi-azeotropy (Xn", Tn', Pn) for evaporating the liquid mixture. In this case, on the basis of the diluting gas composition $Xd=Xn''-Xn'$, the partial pressure Pd is found from $Pn-Pn'$.

That is, in the azeotropic state (Xn, Tn, Pn) at the required pressure Pn, the temperature Tn is excessively high, whereas in the quasi-azeotropic state at the temperature Tn' which is not so high as Tn, the second gas surface treating conditions are suitable when the pressure Pn' is lower than the required pressure Pn. The pressure of the atmosphere for evaporating the liquid mixture is increased by the diluting gas having the partial pressure Pd and the composition of the diluting gas is Xd; thus, an atmosphere in the quasi-azeotropic stare (Xn", Tn', Pn) is formed. In this state, the liquid mixture is evaporated, thereby making it possible to eliminate the need for decreasing the pressure, while decreasing the temperature for evaporation to Tn'.

Although the liquid mixture boils when it is in the azeotropic state, in the quasi-azeotropic state where the temperature is lower and the pressure is higher, the liquid mixture does not boil, thus, there is no possibility of small liquid drops being formed owing to boiling, so that the surface of the substrate can be treated well.

(ii) Concrete Arrangement

Figure 6:
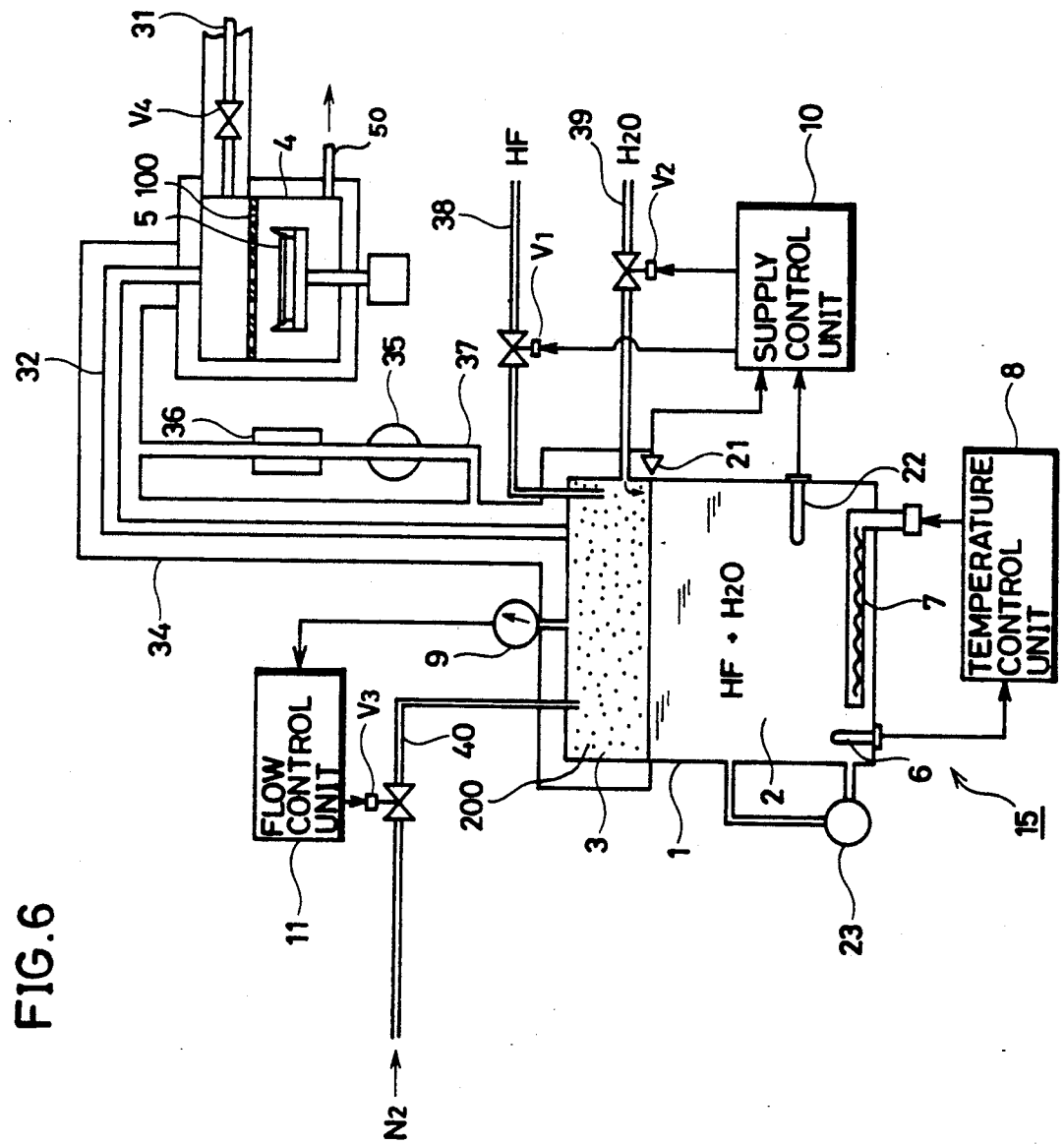
FIG. 6 is a schematic view showing a surface treating apparatus according to a second embodiment of the invention.

The surface treating apparatus according to the second embodiment of the invention will now be described with reference to FIG. 6. In the second embodiment, the apparatus includes, in the space defined in the liquid mixture storage tank 1 in the first embodiment, a pipe 40 for feeding a diluting inert gas, e.g., $N_2$, a pressure sensor 9 for detecting the pressure in the liquid mixture storage tank 1, and a flow control unit 11 for controlling the $N_2$ gas feed rate so that the pressure in the liquid mixture storage tank 1 is maintained at a predetermined pressure which is higher than the atmospheric pressure.

The control unit 11 controls an $N_2$ gas valve V3 placed in the $N_2$ gas pipe 40. The other parts are the same as those found in the surface treating apparatus according to the first embodiment of the invention shown in FIG. 1; thus, the same portions are given the same reference characters to omit a repetitive description thereof.

In the second embodiment of the invention, the liquid mixture 2 is heated by a heater 7 to provide desired quasi-azeotropic condition. As shown in FIG. 2, azeotropic conditions are present at each temperature. Therefore, a vapor mixture 3 is produced at a preset temperature. The partial pressure of this produced vapor mixture is lower than atmospheric pressure, the difference is supplemented by the $N_2$ gas.

The operation of the surface treating apparatus according to the second embodiment will now be described.

In the first embodiment, a liquid mixture of hydrofluoric acid HF and water $H_2O$ has been used as the surface treating liquid mixture 2. To cause it to exhibit azeotropy at 760 mmHg, the temperature T has been 111.4° C. However, this temperature is relatively high. In the second embodiment, to increase safety, the liquid mixture 2 will be evaporated at a lower temperature.

If it is desired to set the evaporation temperature at 47.9° C., it is seen from the sixth row in FIG. 3 that the composition X of hydrofluoric acid HF is 38.83%. To make the atmosphere gas pressure equal to the total pressure $(P_{HF}+P_{H2O})=50$ mmHg, the pressure would have to be reduced. To obviate the need for such pressure reduction, $N_2$ gas serving as a diluting gas is fed to the liquid mixture storage tank 1 through the $N_2$ pipe 40. As a result, the pressure in the liquid mixture storage tank 1 becomes the required pressure (=760 mmHg).

That is, the diluting $N_2$ gas having a partial pressure of $Pn-(P_{HF}+P_{H2O}=760-50=710$ mmHg is fed to the liquid mixture storage tank 1. While nitrogen gas $N_2$ is used as the diluting gas, it is also possible to use inert gases, such as argon, or dry air.

Stored in the liquid mixture storage tank 1 is a surface treating liquid mixture 2 having a composition X which is 38.83% hydrofluoric acid and $100-38.83=61.17\%$ water $H_2O$. Temperature control is effected by a heating device 15 comprising a temperature sensor 6, a heater 7 and a temperature control unit 8 to maintain the temperature T of the liquid mixture 2 at 47.9° C.

Further, the surface treating liquid mixture 2 is evaporated while maintaining the pressure of the atmosphere gas in the liquid mixture storage tank 1, i.e., the sum of the partial pressures $P_{HF}$, $P_{H2O}$ and $P_{N2}$ (=Pd) of hydrogen fluoride gas, water vapor and diluting gas (nitrogen gas), at 760 mmHg. When the atmosphere gas pressure Pn deviates from 760 mmHg, pressure control is effected by a pressure control device comprising a pressure sensor 9, a flow control valve V3 and a flow control unit 11.

In this case, the respective compositions of the hydrogen fluoride gas and water vapor are calculated as follows.

Composition of hydrogen fluoride in liquid mixture: $X_{HF}=38.83\%$

Composition of water $H_2O$ in liquid mixture: $X_{H2O}=61.17\%$

Because of the quasi-azeotropic state, the composition $X_{HF}^*$ of the hydrogen fluoride gas in the vapor mixture of hydrogen fluoride and water (corresponding to the atmosphere gas minus diluting gas) is equal to the composition of the hydrogen fluoride in the liquid mixture. That is;

$$X_{HF}* = X_{HF} = 38.83 \%.$$

Since the composition $X_{H2O}*$ of the water vapor in the vapor mixture of hydrogen fluoride and water is equal to the composition $X_{H2O}$ in the liquid mixture, $$X_{H2O}* = X_{H2O} = 61/17\%.$$

According to Dalton's law, since the partial pressures agree with the composition, the ratio of the hydrogen fluoride gas to the sum $(P_{HF}+P_{H2O})$ of the partial pressures of the hydrogen fluoride and water vapor, i.e., $P_{HF}/(P_{HF}+P_{H2O})$, agrees with $X_{HF}*$.

$$(P_{HF}+P_{H2O})=X_{HF}* = 38/83\% \quad (1)$$

Similarly, the ratio of the partial pressure of the water vapor to the sum $(P_{HF}+P_{H2O})$ of the partial pressures of the hydrogen fluoride and water vapor, i.e., $P_{H2O}/(P_{HF}+P_{H2O})$, agrees with $X_{H2O}*$.

$$P_{H2O}/(P_{HF}+P_{H2O})=X_{H2O}* = 61.17 \quad (2)$$

Since the sum $(P_{HF}+P_{H2O})=50$ mmHg, from Equation (1), the partial pressure $P_{HF}$ of the hydrogen fluoride is:

$$\begin{aligned} P_{HF} &= 50 \times \{P_{HF}/(P_{HF} = P_{H2O})\} \\ &= 50 \times 38.83 \times (1/100) \\ &= 19.415 \text{ mmHg.} \end{aligned}$$

From Equation (2), the partial pressure $P_{H2O}$ of the water vapor is:

$$\begin{aligned} P_{H2O} &= 50 \times \{P_{H2O}/(P_{HF} = P_{H2O})\} \\ &= 50 \times 61.17 \times (1/100) \\ &= 30.585 \text{ mmHg.} \end{aligned}$$

Since the partial pressure ratio and the composition agree with each other, as described above, the composition $X_{HF}\#$ of the hydrogen fluoride gas in the atmosphere gas agrees with the partial pressure $P_{HF}$ of the hydrogen fluoride gas in the atmosphere gas. Thus, $$X_{HF}\# = (P_{HF}/760) \times 100 = 2.555\%.$$

Similarly, the composition $X_{H2O}\#$ of the water vapor in the atmosphere gas agrees with the partial pressure $P_{H2O}$ of the water vapor with respect to the total pressure of the atmosphere gas. Thus:

$$X_{H2O}\# = P_{H2O}760 \times 100 = 4.024\%.$$

In addition, the composition $X_{N2}\#$ of the nitrogen gas $N_2$ in the atmosphere gas is:

$$\begin{aligned} X_{N2}\# &= 100 - (X_{HF}\# + X_{H2O}\#) \\ &= 100 - (2.555 + 4.024) = 93.421. \end{aligned}$$

Therefore, $$X_{HF}\#:X_{H2O}\#:X_{N2}\# = 2.555:4.024:93.421.$$

The composition $X_{HF}\#$ of the hydrogen fluoride in the atmosphere gas differs from the composition $X_{HF}$ of the hydrogen fluoride gas in the liquid mixture, and the composition $X_{H2O}\#$ of the water vapor in the atmosphere gas also differs from the composition $X_{H2O}$ of the water in the liquid mixture.

However, such differences $(X_{HF}\# \neq X_{HF}, X_{H2O}\# \neq X_{H2O})$ are not important for the treatment of the surface of a substrate 5. What is important is that the ratio of the compositions, $(X_{HF}\#:X_{H2O}\#)$, of the hydrogen fluoride gas and the water vapor is equal to the ratio of the compositions, $(X_{HF}:X_{H2O})$, of the hydrogen fluoride and water in the liquid mixture.

In the liquid mixture, as described above, $$X_{HF}:X_{H2O} = 38.83:61.17.$$

As is apparent from the above equation, $$X_{HF}\#:X_{H2O}\# = 2.555:4.024.$$

Therefore, $$X_{HF}\#:X_{H2O}\# = X_{HF}:X_{H2O}$$

As shown above, in the second embodiment also, the composition of the liquid mixture coincides with the composition of the atmosphere gas.

Therefore, the composition of the vapor mixture fed to the substrate 5 disposed in the treating chamber 4 is maintained constant all the time, so that the surface treatment of the substrate 5 can be performed well. Furthermore, the production of the vapor mixture at ordinary temperature and at atmospheric pressure is made possible; thus, safety is further increased and there is no need for pressure reduction.

To achieve this, however, the composition of the liquid mixture must be held at the composition associated with the quasi-azeotropic state, but even in the quasi-azeotropic state, the liquid mixture evaporates in such a manner as to produce vapor of the same composition as that of the liquid mixture; therefore, there is no possibility of the composition varying as the evaporation of the liquid mixture proceeds. Therefore, even when the liquid mixture decreases in amount as it evaporates, a fresh liquid mixture of the same composition may be fed. Besides a liquid mixture of hydrofluoric acid HF and water $H_2O$, use may be made of a liquid mixture of hydrochloric acid HCl and water $H_2O$ and a liquid mixture of hydrofluoric acid HF, water $H_2O$ and ethanol $C_2H_5OH$ as in the case of the first embodiment.

In the case of the former, the quasi-azeotropic conditions are as follows. The concentration of the hydrochloric acid HCl is 20%, and the concentration of water $H_2O$ is 80% and the temperature is 20° C. Then, since the saturated vapor pressure of the vapor mixture of the hydrogen chloride and water is about 0.2 mmHg, the partial pressure of the $N_2$ gas is about 759.8 mmHg.

As example of the treating capacity of the surface treating apparatus according to the second embodiment will now be given. A description will be given of a case where the liquid mixture 2 of hydrofluoric acid HF and water $H_2O$ is used under the quasi-azeotropic conditions. With 7.2% vapor mixture of hydrogen fluoride and water, 92.8% nitrogen and a temperature of 50° C., the partial pressure of the vapor mixture is 55 mmHg.

Then, the oxide film $SiO_2$ on the surface of the silicon substrate Si 5 is etched at the rate of about 5,400 Å/min.

In each embodiment described above, the etching or cleaning of substrates has been described. In a film forming operation on substrates, the present invention is also applicable to evaporation of a liquid mixture containing a solution of film forming material under azeotropic or quasi-azeotropic conditions.

Figure 7:
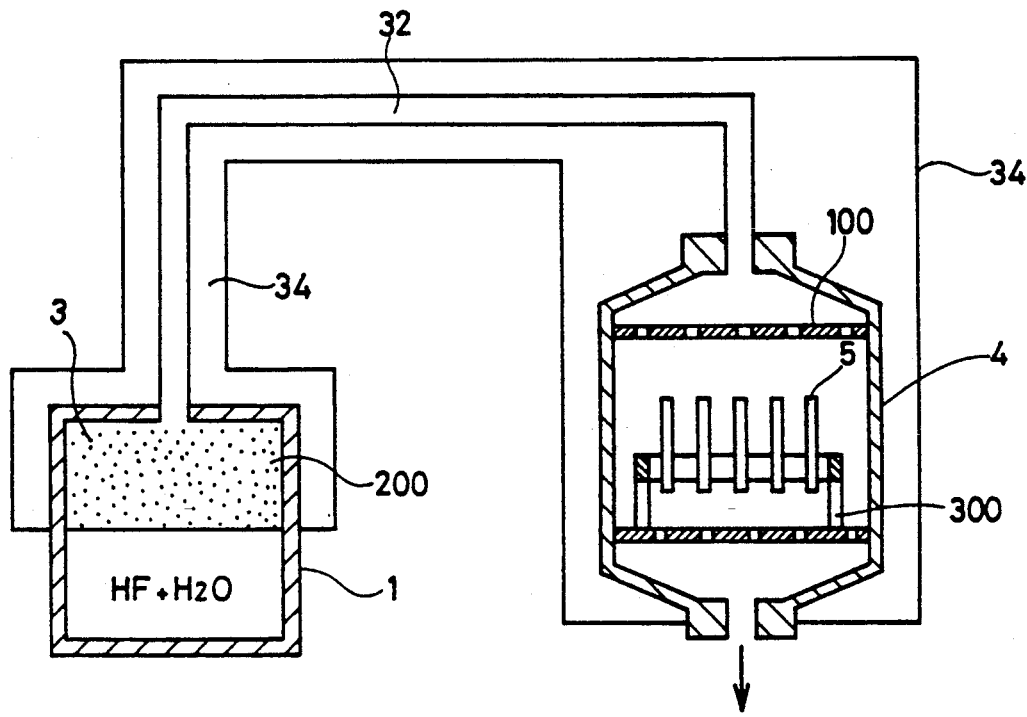
FIGS. 7 and 8 are sectional views of the treating chamber 4 in the batch processing system.
Figure 8:
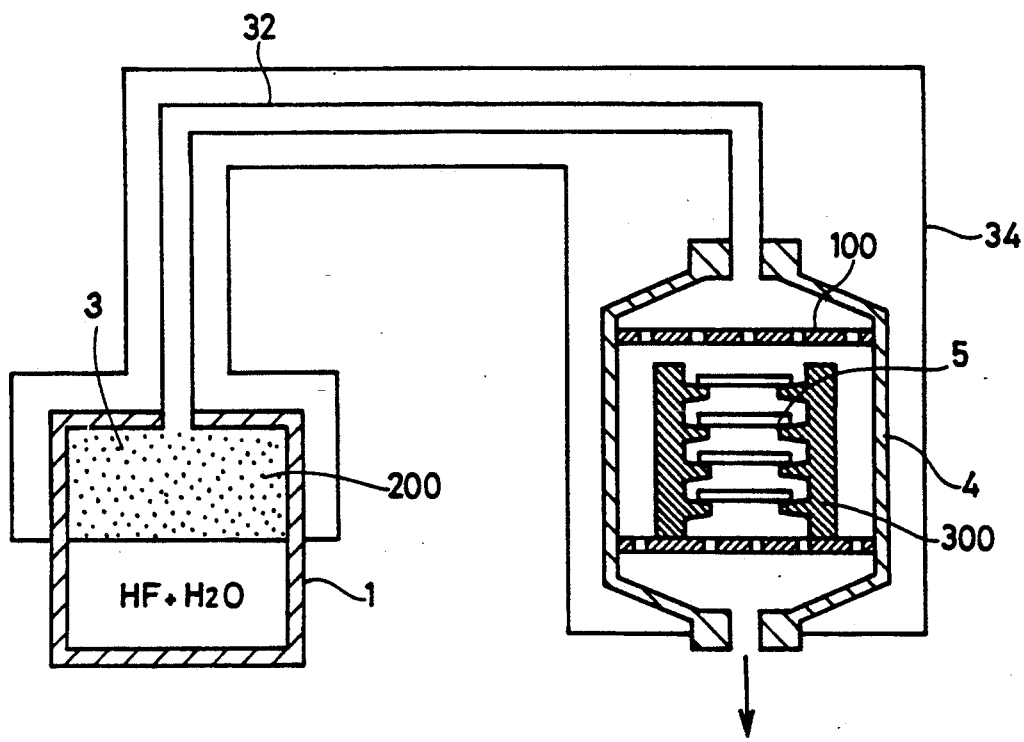

In the above embodiments, the substrate is treated piece by piece in the treating chamber 4. This invention can be applied to the batch processing system wherein a plurality of substrates 5 are accommodated in a wafer cassette 300 and treated in the treating chamber 4 as shown in FIGS. 7 and 8. The substrates are placed vertically in FIG. 7 and horizontally in FIG. 8, respectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface treatment method of etching or cleaning a wafer, said method comprising the steps of:
   preparing a liquid mixture of at least two liquids which exhibits an azeotropic phenomenon under predetermined conditions, said liquid mixture being selected from the group consisting of: (a) hydrofluoric acid and water; (b) hydrochloric acid and water; (c) hydrofluoric acid, water, and ethanol; (d) hydrofluoric acid, nitric acid, and water; (e) hydrochloric acid, nitric acid, and water; (f) ammonium hydroxide and water; and (g) nitric acid and water; and
   controlling said liquid mixture to satisfy said predetermined azeotropic conditions, said controlling step including the step of setting the pressure to atmospheric pressure or more;
   an azeotropic vapor mixture of said liquid mixture being produced under said azeotropic conditions;
   etching or cleaning the surface of a wafer to be treated by using said azeotropic vapor mixture.

2. A method as set forth in claim 1, wherein:
   said liquid mixtures includes hydrofluoric acid and water.

3. A method as set forth in claim 1, wherein:
   said liquid mixture includes hydrochloric acid and water.

4. A method as set forth in claim 1, wherein:
   said etching or cleaning step includes the step of conveying said azeotropic vapor mixture to a wafer holding chamber for performing etching or cleaning of said wafer.

5. A method as set forth in claim 4, wherein:
   said etching or cleaning step includes the step of keeping said wafer holding chamber at a predetermined temperature which prevents said azeotropic vapor mixture from dewing and supplying said azeotropic vapor mixture to said wafer holding chamber.

6. A method as set forth in claim 1, further comprising:
   the step of feeding a diluting gas for decreasing the concentration of said vapor mixture in said wafer holding chamber.

7. A method as set forth in claim 1, wherein:
   said step of preparing a liquid mixture of at least two liquids includes the step of separately feeding tow liquids to a liquid holding means.

8. A method as set forth in claim 1, wherein:
   said step of preparing a liquid mixture includes the step of preparing holding means for holding said liquid mixture, and the step of feeding said liquid mixture to said holding means, whereby a space is defined in the region of said holding means where said liquid mixture is not held,
   said azeotropic vapor mixture is produced in said space,
   said step of controlling said liquid mixture to satisfy said predetermined azeotropic conditions includes the step of setting said holding means at a predetermined temperature,
   said etching or cleaning further includes the step of generating a quasi-azeotropic vapor mixture by feeding a diluting gas to said space so that the pressure in said space is equal to or greater than atmospheric pressure.

9. A method as set forth in claim 8, wherein:
   said step of feeding a diluting gas includes the step of feeding said diluting gas in accordance with the pressure of said azeotropic vapor mixture in said holding means.

10. A method as set forth in claim 8, further comprising the step of supplying said quasi-azeotropic vapor mixture from said space to said wafer holding chamber for performing surface treatment of said wafer, the temperature of said quasi-azeotropic vapor mixture from generation thereof to treatment of said wafer through supplying of said vapor mixture to said wafer holding chamber.

11. A method as set forth in claim 8, further comprising the step of keeping said dilution gas at a predetermined temperature.

12. A method as set forth in claim 1, wherein said liquid mixture includes nitric acid and water.

13. A surface treating method of etching or cleaning a wafer, said method comprising:
   preparing a liquid mixture of at least two liquids which exhibits an azeotropic phenomenon under predetermined conditions, said preparing step including preparing holding means for holding said liquid mixture and feeding said liquid mixture to said holding means, whereby a space is defined in the region of said holding means where said liquid mixture is not held;
   controlling said liquid mixture to satisfy said predetermined azeotropic conditions;
   an azeotropic vapor mixture of said liquid mixture of said at least two liquids being produced in said space under said azeotropic conditions;
   generating a quasi-azeotropic vapor mixture by feeding a diluting gas to said space so that the pressure in said space is equal to or greater than atmospheric pressure; and
   etching or cleaning the surface of a wafer to be treated by using said quasi-azeotropic vapor mixture.

14. A wafer surface treating apparatus for etching or cleaning a wafer comprising:
   liquid holding means for holding a mixture of at least two liquids which exhibit azeotropy under predetermined conditions, said liquid holding means having space for generating vapor mixture of azeotropy in the upper portion thereof;

azeotropic condition setting means for conditioning said liquid holding means to establish said predetermined azeotropic conditions, said azeotropic condition setting means setting temperature and pressure to the predetermined azeotropic conditions;

diluting gas feeding means for feeding a diluting gas to said space thereby to generate a quasi-azeotropic vapor mixture; and surface treating means for etching or cleaning the surface of a wafer to be treated by using said vapor mixture of quasi-azeotropy, said surface treating means including a wafer holding chamber for effecting surface treatment of etching or cleaning of said wafer, and quasi-azeotropic vapor mixture supplying means for supplying said quasi-azeotropic vapor mixture to said wafer holding chamber.

15. A wafer surface treating apparatus as set forth in claim 14, also comprising a mixture of at least two liquids disposed within said liquid holding means;

said mixture of at least two liquids including hydrogen fluoride and water.

16. A wafer surface treating apparatus as set forth in claim 14, also comprising a mixture of at least two liquids disposed within said liquid holding means;

said mixture of at least two liquids include hydrochloric acid and water.

17. A wafer surface treating apparatus as set forth in claim 14, also comprising a mixture of at least two liquids disposed within said liquid holding means;

said mixture of at least two liquids including nitric acid and water.

18. A wafer surface treating apparatus as set forth in claim 14, wherein:

said wafer surface treating apparatus includes temperature controlling means for keeping said space, said wafer holding chamber and said quasi-azeotropic vapor mixture supplying means at a predetermined temperature.

19. A surface treating apparatus as set forth in claim 14, wherein:

said predetermined conditions include a temperature above the dew point of said quasi-azeotropic vapor mixture.

20. A wafer surface treating apparatus as set forth in claim 14, further comprising liquid feeding means for feeding said liquid mixture of said at least two liquids to said liquid holding means.

21. A surface treating apparatus as set forth in claim 20, wherein:

said liquid holding means includes detecting means for detecting the held amount of said liquid mixture of said at least two liquids, and said liquid feeding means operates in response to a detection signal from said detecting means.

22. A wafer surface treating apparatus as set forth in claim 20, wherein:

said liquid holding means includes stirring means for stirring said liquid mixture.

23. A surface treating apparatus as set forth in claim 18, wherein:

said predetermined conditions include a temperature above the dew point of said quasi-azeotropic vapor mixture.

24. A surface treating apparatus as set forth in claim 14, wherein:

said diluting gas includes an inert gas.

25. A surface treating apparatus as set forth in claim 14, wherein:

said inert gas includes nitrogen gas.

26. A surface treating apparatus as set forth in claim 14, further comprising control means for controlling said diluting gas feeding means to feed said diluting gas in accordance with the pressure of said quasi-azeotropic vapor mixture in said space of said liquid holding means.

27. An apparatus as set forth in claim 14, further comprising temperature controlling means for keeping said diluting means at a predetermined temperature.

* * * * *